(12) United States Patent
Shibata

(10) Patent No.: US 10,893,225 B2
(45) Date of Patent: Jan. 12, 2021

(54) ELECTRONIC DEVICE HAVING LARGE DYNAMIC RANGE FOR IMAGE SENSING

(71) Applicant: InnoLux Corporation, Miao-Li County (TW)

(72) Inventor: Junya Shibata, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/429,082

(22) Filed: Jun. 3, 2019

(65) Prior Publication Data

US 2020/0382734 A1    Dec. 3, 2020

(51) Int. Cl.
| | |
|---|---|
| H01J 40/14 | (2006.01) |
| H01L 31/00 | (2006.01) |
| H01L 27/146 | (2006.01) |
| H04N 5/376 | (2011.01) |
| H04N 5/378 | (2011.01) |
| H04N 5/355 | (2011.01) |

(52) U.S. Cl.
CPC ....... *H04N 5/378* (2013.01); *H01L 27/14614* (2013.01); *H01L 27/14623* (2013.01); *H01L 27/14636* (2013.01); *H04N 5/355* (2013.01)

(58) Field of Classification Search
CPC . H01L 21/561; H01L 23/3114; H01L 23/552; H01L 23/64; H01L 25/16; H01L 2224/73265; H01L 2924/01078; H01L 2924/01079; H01L 2924/01322; H01L 2924/13091
See application file for complete search history.

(56) References Cited

U.S. PATENT DOCUMENTS

| | | | | |
|---|---|---|---|---|
| 5,140,551 | A | * 8/1992 | Chiu | G11C 14/00 257/296 |
| 2002/0190229 | A1 | 12/2002 | Nakamura | |
| 2014/0061739 | A1* | 3/2014 | Kurokawa | G06F 3/0412 257/292 |
| 2019/0221597 | A1* | 7/2019 | Noh | H01L 27/14623 |

* cited by examiner

*Primary Examiner* — Brian Turner
(74) *Attorney, Agent, or Firm* — Winston Hsu

(57) ABSTRACT

An electronic device includes a first sensing module and a first threshold voltage generation module. The first sensing module includes a first sensing transistor having a first gate, a second gate and a semiconductor layer. The semiconductor layer of the first sensing transistor is disposed between the first gate and the second gate of the first sensing transistor. The first gate of the first sensing transistor is coupled to a top gate line. The first threshold voltage generation module includes a node coupled to the second gate of the first sensing transistor, and is used to provide a first threshold voltage in a dark state to the node of the first threshold voltage generation module.

19 Claims, 6 Drawing Sheets

ELECTRONIC DEVICE HAVING LARGE
DYNAMIC RANGE FOR IMAGE SENSING

BACKGROUND OF THE DISCLOSURE

1. Field of the Disclosure

The disclosure relates to image sensing, and specifically, to an electronic device having a large dynamic range for image sensing.

2. Description of the Prior Art

An image sensing system adopts a photo sensor to detect and convey light information. Photo sensors may be implemented by a variety of technologies including charge-coupled devices (CCD), complementary metal-oxide-semiconductor (CMOS), and thin-film-transistor (TFT). Conventionally, when adopting the TFT technology for photo sensors, calibrations are often required to determine suitable gate control voltages for reading the light information captured by the TFT devices. However, the calibrations can be a time consuming process as suitable gate control voltages of different TFT devices may be different owing to variations in manufacturing process and operating temperature and may have to be separately identified.

Therefore, it is desirable to have an electronic device capable of adaptively adjusting a gate control voltage of a TFT device, thereby providing a large dynamic range of image sensing irrespective of process and temperature variations.

SUMMARY OF THE DISCLOSURE

In one embodiment, an electronic device includes a sensing module and a threshold voltage generation module. The sensing module includes a sensing transistor having a first gate, a second gate and a semiconductor layer. The semiconductor layer of the sensing transistor is disposed between the first gate and the second gate of the sensing transistor. The first gate of the first sensing transistor is coupled to a top gate line. The threshold voltage generation module includes a node coupled to the second gate of the sensing transistor, and is used to provide a threshold voltage in a dark state to the node of the threshold voltage generation module.

These and other objectives of the present disclosure will no doubt become obvious to those of ordinary skill in the art after reading the following detailed description of the embodiment that is illustrated in the various figures and drawings.

DETAILED DESCRIPTION

Figure 1:
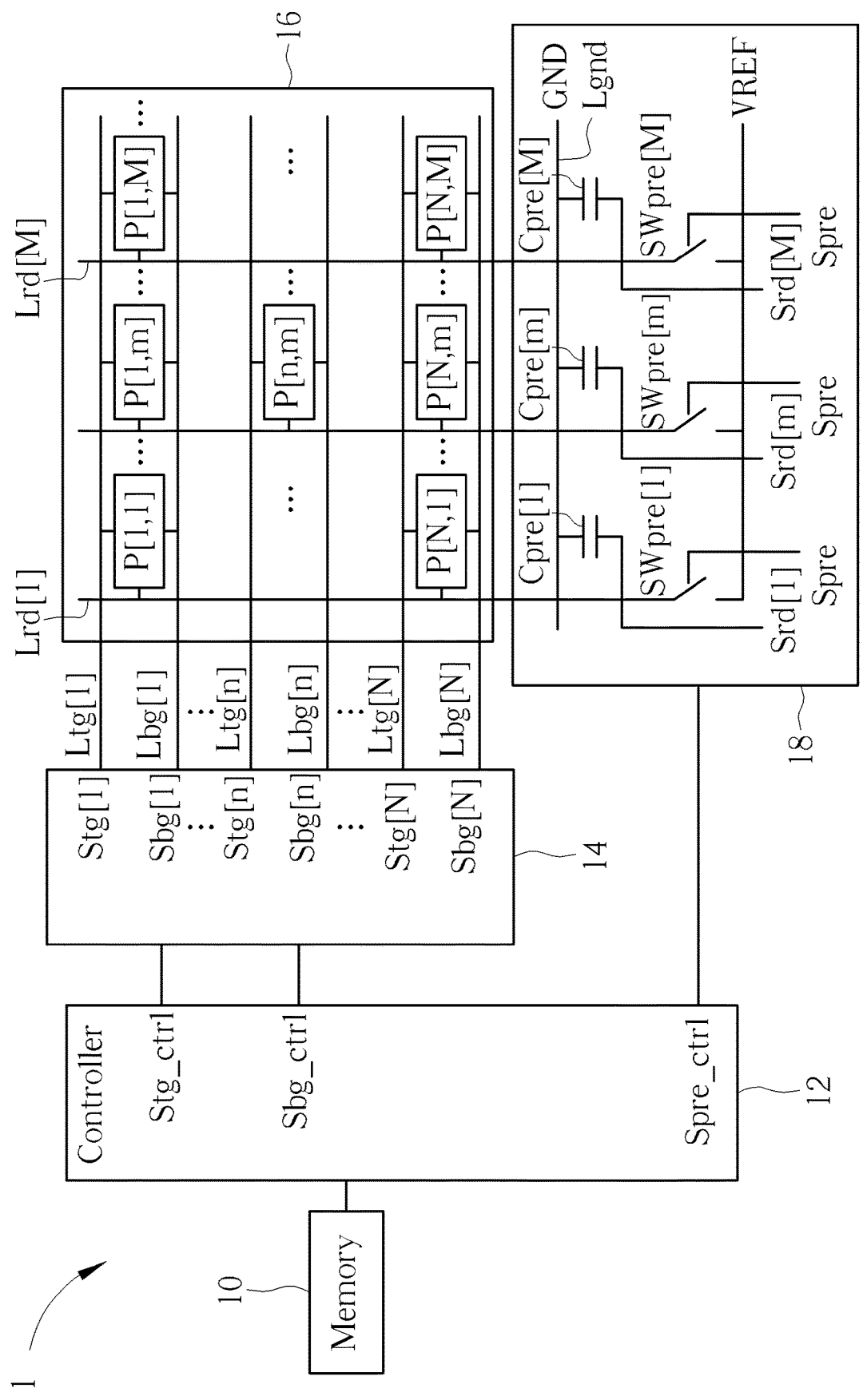
FIG. 1 is a control block diagram of an electronic device according to an embodiment of the disclosure.

FIG. 1 is a control block diagram of an electronic device 1 according to an embodiment of the disclosure. The electronic device 1 comprises memory 10, a controller 12, a top gate and bottom gate driver 14, a photo sensor array 16 and a readout driver 18. The controller 12 is coupled to the memory 10, the top gate and bottom gate driver 14 and the readout driver 18. The top gate and bottom gate driver 14 is coupled to the photo sensor array 16 via top gate lines Ltg[n] and bottom gate lines Lbg[n], where n is a row index and a positive integer ranging between 1 and N. The readout driver 18 is coupled to the photo sensor array 16 via readout lines Lrd[m], where m is a column index and a positive integer ranging between 1 and M.

As used herein, the term "coupled" may refer to a direct electrical connection between two components or an indirect electrical connection in which a third component is present between two components. The coupled as defined herein is applicable to all embodiments throughout the disclosure. Further, numerical orders such as a first reference transistor, a second reference transistor, a first sensing transistor, and a second sensing transistor merely serve to identify each component, and do not serve as a limitation to the components or an order of the components. The term "top gate" and "bottom gate" serve to associate with two separate gates of a double-gate thin-film transistor, and are not intended to limit the up-down positional relationship.

The photo sensor array 16 comprises an array of photo sensor pixels P[n,m] arranged in rows and columns, n being the row index ranging from 1 to N and m being the column index ranging from 1 to M. Each photo sensor pixel P[n,m] may comprise a double-gate transistor such as a double-gate thin-film transistor (DGTFT), and may be coupled to the top gate and bottom gate driver 14 via a top gate line Ltg[n] and a bottom gate line Lbg[n] and the readout driver 18 via a readout line Lrd[m].

The memory 10 may store top gate signal settings, bottom gate signal settings and pre-charge signal settings including voltage ranges and timings of top gate signals Stg[n], bottom gate signals Sbg[n] and pre-charge signals Spre. The controller 12 may read the top gate signal settings, the bottom gate signal settings and the pre-charge signal settings from the memory 10 to output a top gate setting signal Stg ctrl and a bottom gate setting signal Sbg ctrl to the top gate and bottom gate driver 14 and output a pre-charge setting signal Spre ctrl to the readout driver 18. Subsequently, the top gate and bottom gate driver 14 may generate the top gate signals Stg[n] according to the top gate setting signal Stg ctrl, generate the bottom gate signals Sbg[n] according to the bottom gate setting signal Sbg ctrl, and drive the photo sensor pixels P[n,m] using the top gate signals Stg[n] and the bottom gate signals Sbg[n].

The readout driver 18 comprises a plurality of pre-charge switches SWpre[m] and a plurality of storage capacitors Cpre[m], each storage capacitor Cpre[m] being coupled between a ground voltage GND and a pre-charge switch SWpre[m], each pre-charge switch SWpre[m] being coupled between a reference voltage VREF and a storage capacitor Cpre[m], and m being the column index ranging from 1 to M. Further, the readout driver 18 may generate the pre-charge signals Spre according to the pre-charge setting signal Spre ctrl to control the pre-charge switches SWpre [m], and acquire light information captured by the photo sensor pixels P[n,m] as a readout signal Srd[m] from the readout line Lrd[m].

Figure 2:
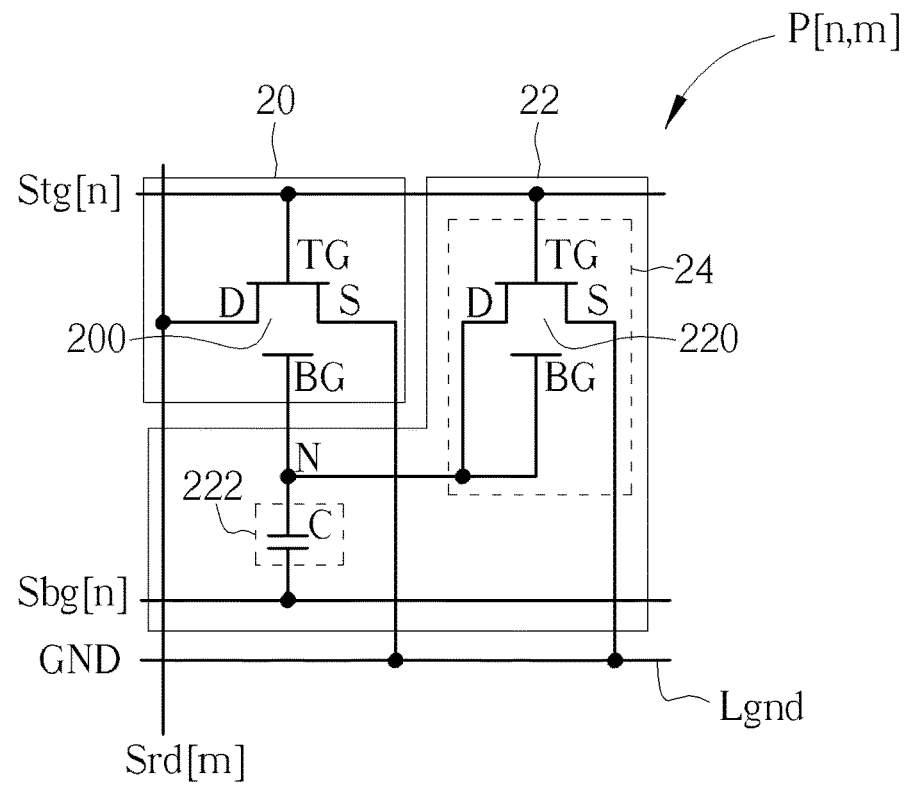
FIG. 2 is a circuit schematic diagram of an exemplary photo sensor pixel of the photo sensor array in FIG. 1.

FIG. 2 is a circuit schematic diagram of an exemplary photo sensor pixel P[n,m] of the photo sensor array 16 in FIG. 1. The photo sensor pixel P[n,m] comprises a first sensing module 20 and a first threshold voltage generation module 22 coupled thereto. The first sensing module 20 comprises a first sensing transistor 200. The first sensing transistor 200 may be a double-gate transistor having a first gate TG coupled to the top gate line Ltg[n], a second gate BG coupled to the bottom gate line Lbg[n] and the first threshold voltage generation module 22, a semiconductor layer disposed between the first gate TG and the second gate BG, a drain D coupled to the readout line Lrd[m] and a source S coupled to a ground voltage line Lgnd carrying the ground voltage GND. The first threshold voltage generation module 22 comprises a node N coupled to the second gate BG of the first sensing transistor 200, and may provide a first threshold voltage in a dark state as a readout voltage to the node N.

The semiconductor layer of the first sensing transistor 200 may absorb light energy and generate a quantity of hole carriers in proportion to a magnitude of the absorbed light energy, resulting in a threshold voltage Vth corresponding to the accumulated hole carriers. Specifically, the first sensing transistor 200 may be operated in a bright state and a dark state. The bright state indicates incident light is irradiated. The dark state indicates incident light is blocked, not irradiated or has illumination below 5 lux. When operated in the dark state, the first sensing transistor 200 may accumulate a small quantity of hole carriers, resulting in a higher threshold voltage Vth_drk; whereas when operated in the bright state, the first sensing transistor 200 may accumulate a larger quantity of hole carriers than that in the dark state, resulting in a threshold voltage Vth_brt lower than the threshold voltage Vth_drk.

Figure 3:
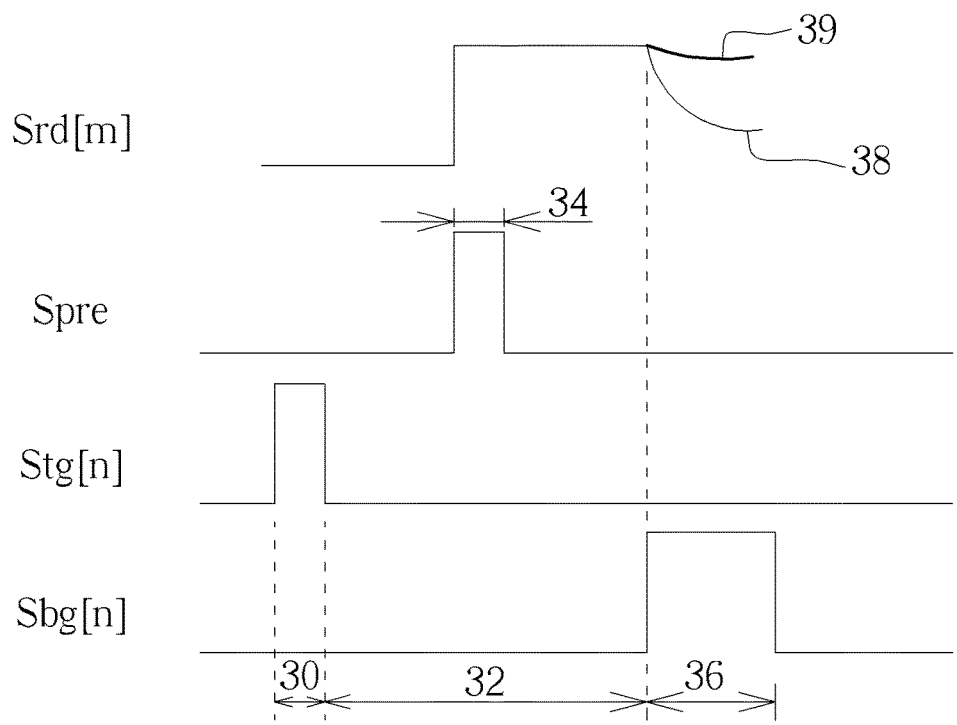
FIG. 3 is a timing diagram of selected signals of the electronic device in FIG. 1.

FIG. 3 is a timing diagram of selected signals of the electronic device 1 in FIG. 1, the selected signals include the readout signal Srd[m], the pre-charge signal Spre, the top gate signal Stg[n] and the bottom gate signal Sbg[n].

Each photo sensor pixel P[n,m] may operate in a reset mode 30, a sensing mode 32, a pre-charge mode 34 or a read mode 36. In the reset mode 30, the top gate signal Stg[n] may be set to a high voltage level to clear charges held by the first sensing transistor 200, and the readout signal Srd[m] may be reset to the ground voltage GND. In the sensing mode 32, the top gate signal Stg[n] may be set to a low voltage level, the first sensing transistor 200 may start accumulate hole carriers according to the light condition. In the pre-charge mode 34, the pre-charge signal Spre may be set to a high voltage level to close the pre-charge switch SWpre[m] and charge the storage capacitor Cpre[m] to the reference voltage VREF prior to reading the readout signal Srd[m], and the readout signal Srd[m] may be raised to the reference voltage VREF. While operating in the sensing mode 32, the electronic device 1 may be set to the pre-charge mode 34 to pre-charge the storage capacitor Cpre[m]. In the read mode 36, the bottom gate signal Sbg[n] may be set to a high voltage level to turn on the first sensing transistor 200, and the voltage of the readout signal Srd[m] may start dropping from the reference voltage VREF. Accordingly, the first sensing transistor 200 may have different threshold voltages in different light conditions, producing different sizes of leakage currents flowing from the storage capacitor Cpre[m] to the ground voltage line Lgnd and resulting in a faster voltage drop rate of the readout signal Srd[m] for the bright state, as indicated by a line 38, and a slower voltage drop rate of the readout signal Srd[m] for the dark state, as indicated by a line 39. The high voltage levels and low voltage levels of the pre-charge signal Spre, the top gate signal Stg[n] and the bottom gate signal Sbg[n] may or may not be the same. The low voltage level of the top gate signal Stg[n] may be less than the ground voltage GND. The low voltage levels of the bottom gate signal Sbg[n] and the pre-charge signal Spre may be equal to or exceed 0V.

Figure 4:
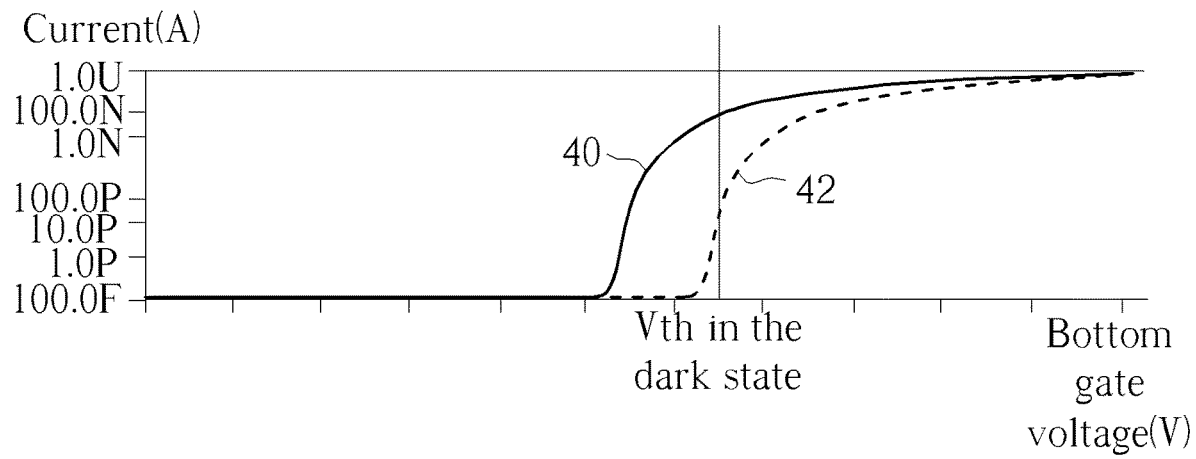
FIG. 4 shows a relationship of leakage currents and bottom gate voltages of a sensing transistor of the photo sensor array in FIG. 1.

FIG. 4 shows I-V curves 40, 42 of the bottom gate of the double-gate transistor in the photo sensor array 16 in a bright state (such as line 40) and a dark state (such as line 42) respectively when the top gate voltage is set to a low level, where the x-axis represents the bottom gate voltage in volts and the y-axis represents the leakage currents in amperes. The I-V curves 40, 42 of the bottom gate changes in accordance with the top gate voltage. In FIG. 4, the double-gate transistor has a higher threshold voltage in the dark state than in the bright state FIG. 4 shows the I-V curves for a typical process, and it should be noted that the I-V curves may be shifted owing to process variations and temperature variations.

During the read mode 36, the high voltage level of the bottom gate signal Sbg[n] may be set to a suitable voltage to provide a large dynamic range of image sensing for both the dark state and the bright state. More specifically, the high voltage level of the bottom gate signal Sbg[n] may be set to the threshold voltage of the double-gate transistor in dark state, providing a bright state leakage current large enough to discharge the readout signal Srd[m] quickly during the bright state, and a dark state leakage current small enough to discharge the readout signal Srd[m] at a reasonable speed during the dark state.

In FIG. 2, the first threshold voltage generation module 22 comprises the first reference transistor 220 and a first clamping circuit 222 coupled to the first sensing transistor 200, the first reference transistor 220 and the bottom gate line Lbg[n]. The bottom gate line Lbg[n] carries the bottom gate signal Sbg[n] configured to read light information captured by the first sensing module 20. The photo sensor pixel P[n,m] of the photo sensor array 16 utilizes a first reference transistor 220 to produce the value of the threshold voltage in the dark state, and bias the second gate BG of the first sensing transistor 200 using the value of the threshold voltage in the dark state, so as to compensate for the shift of the threshold voltage in the dark state resulting from the process variations and the temperature variations.

The first reference transistor 220 has a first gate TG coupled to the top gate line Ltg[n], a second gate BG coupled to the bottom gate line Lbg[n] via the first cramping circuit 222, a semiconductor layer disposed between the first gate TG and the second gate BG, a source S coupled to the ground voltage line Lgnd carrying the ground voltage GND and a drain D coupled to the second gate BG. The first reference transistor 220 and the first sensing transistor 200 are substantially matched. The first sensing transistor 200 and the first reference transistor 220 may be n-type double gate thin-film transistors (DGTFT) or p-type double gate thin-film transistors, and may be a poly-silicon type of double gate thin-film transistors, an amorphous-silicon type of double gate thin-film transistors and other types of double gate thin-film transistors.

The first reference transistor 220 is configured as a diode and is shielded by a light-blocking material 24, so as to generate the first threshold voltage in the dark state regardless of the variations in process and/or temperature. More specifically, the first reference transistor 220 has a substantially identical size and structure as the first sensing transistor 200, and the semiconductor layer of the first reference transistor 220 is covered with the light-blocking material 24 to fully shield the semiconductor layer from any light.

The first clamping circuit 222 comprises a clamp capacitor C having a first terminal coupled to the first sensing transistor 200 and the first reference transistor 220, and a second terminal coupled to the bottom gate line Lbg[n]. The first clamping circuit 222 may fix the maximum voltage level of the bottom gate signal Sbg[n] at the first threshold voltage in the dark state. The electronic device 1 utilizes the threshold voltage generation module 22 to adaptively generate a first threshold voltage in a dark state independent of process variations and temperature variations to read the light information captured by a sensing module, thereby increasing a dynamic range of image sensing and enhancing image quality.

The electronic device 1 is not limited by the above embodiment, and may be implemented by variations of the embodiment. For simplicity, components in the variations of the embodiments and identical to those in the first embodiment are referred to in the following paragraphs using identical symbols or numbers. In order to focus on differences between the first embodiment and the variations thereof, only the differences are explained in the following paragraphs, and explanations for the common components are omitted for brevity.

Figure 5:
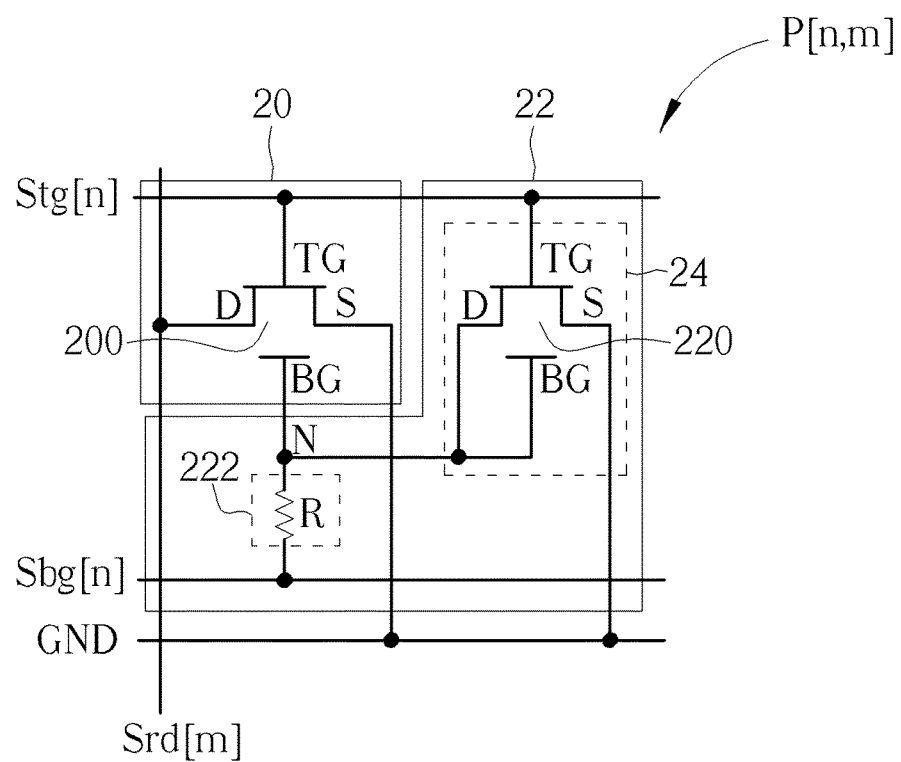
FIG. 5 is a circuit schematic diagram of another exemplary pixel of the photo sensor array in FIG. 1.

FIG. 5 is a circuit schematic diagram of another exemplary pixel P[n,m] of the photo sensor array 16 in FIG. 1, where the circuit configuration in FIG. 5 is almost identical to FIG. 2 except that the first clamping circuit 222 comprises a resistor R in place of the clamping capacitor C. The resistor R has a first terminal coupled to the first sensing transistor 200 and the first reference transistor 220, and a second terminal coupled to the bottom gate line Lbg[n]. The first threshold voltage generation module 22 may generate and provide the first threshold voltage in the dark state to the second gate BG of the first sensing transistor 200 via the node N.

Figure 6:
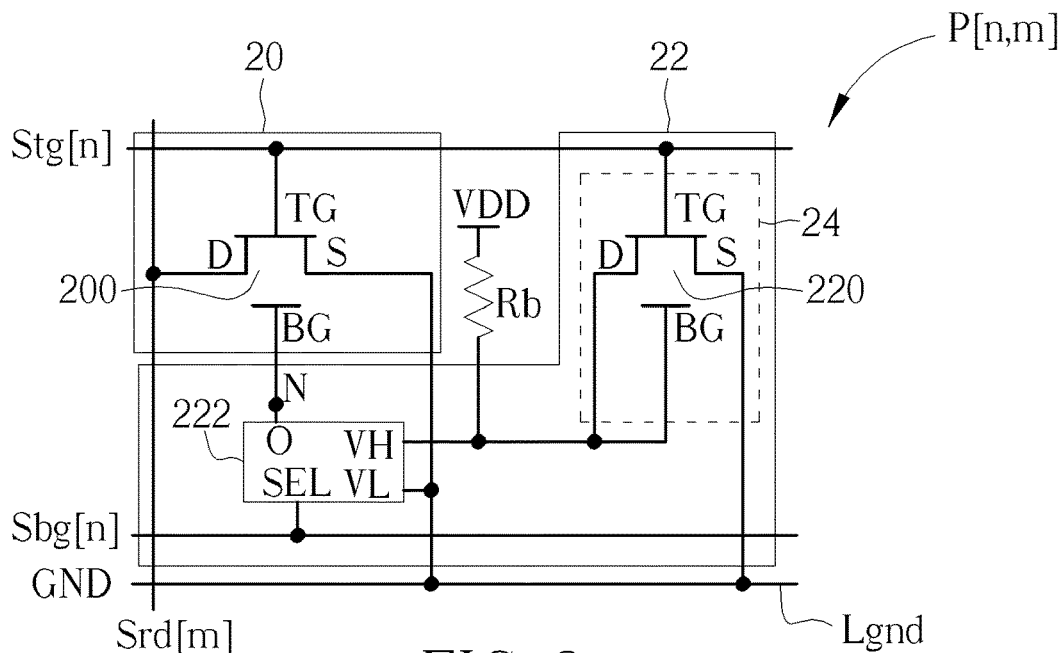
FIG. 6 is a circuit schematic diagram of yet another exemplary pixel of the photo sensor array in FIG. 1.

FIG. 6 is a circuit schematic diagram of yet another exemplary pixel P[n,m] of the photo sensor array 16 in FIG. 1, where the circuit configuration in FIG. 6 is almost identical to FIG. 2 except that the first threshold voltage generation module 22 further comprises a bias resistor Rb coupled between a supply voltage VDD and the second gate BG of the first reference transistor 220, and the first clamping circuit 222 comprises a multiplexer MUX in place of the clamping capacitor C. The bias resistor Rb serves to provide a bias voltage to the second gate BG of the first reference transistor 220, so as to generate the first threshold voltage in the dark state. The supply voltage VDD exceeds the first threshold voltage in the dark state. The multiplexer MUX is coupled to the first sensing transistor 200, the first reference transistor 220, the first bottom gate line Lbg[n] and the ground voltage line Lgnd, and may select one between the ground voltage GND and the first threshold voltage in the dark state according to the first bottom gate signal Sbg[n] and output the selected one as a readout voltage to the first sensing transistor 200.

In particular, the first bottom gate signal Sbg[n] serves as a selecting signal to select one of the ground voltage GND and the first threshold voltage in the dark state as the readout voltage. When the first bottom gate signal Sbg[n] is set to the low voltage level, the ground voltage GND is output to the second gate BG of the first sensing transistor 200, disabling reading of the light information captured by the first sensing transistor 200. When first bottom gate signal Sbg[n] is set to the high voltage level, the first threshold voltage in the dark state is output to the second gate BG of the first sensing transistor 200, enabling reading of the light information captured by the first sensing transistor 200.

Figure 7:
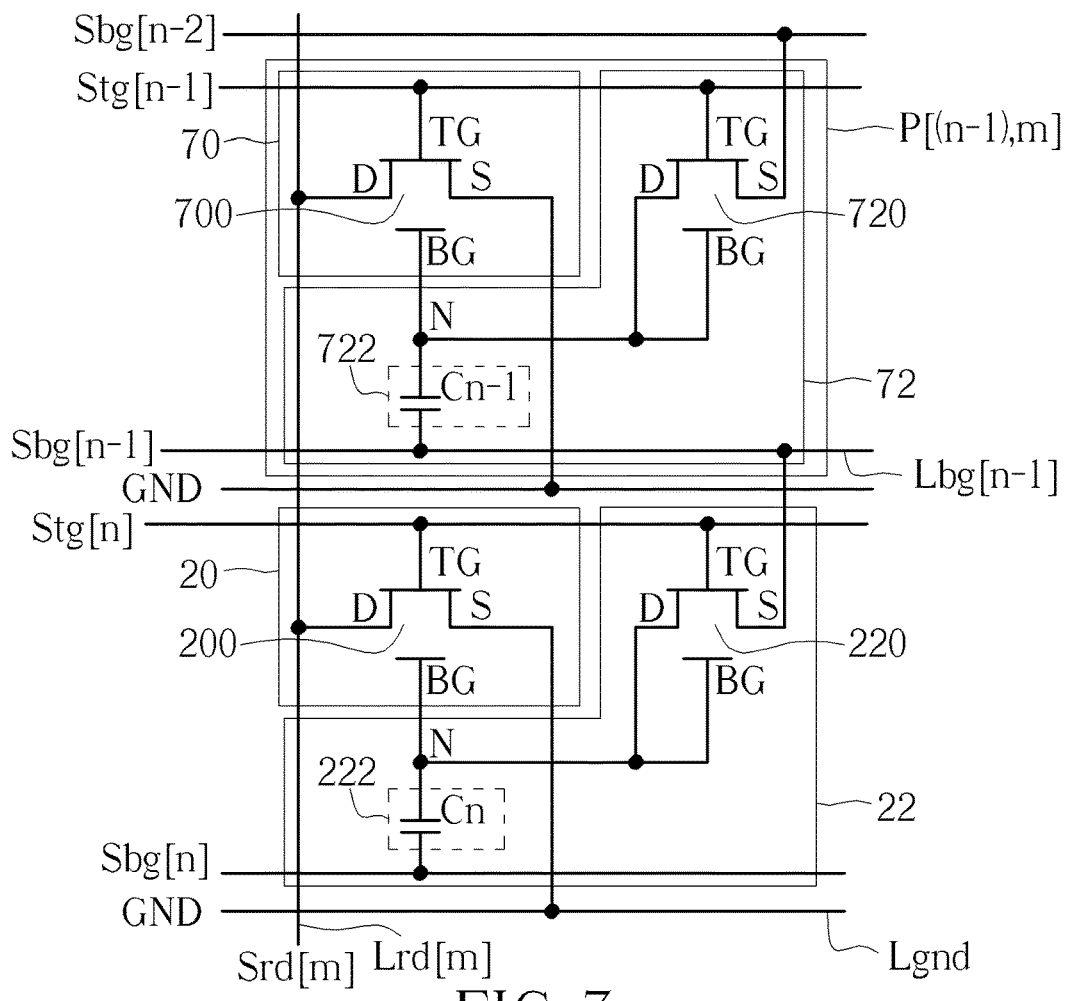
FIG. 7 is a circuit schematic diagram of exemplary pixels of the photo sensor array in FIG. 1.
Figure 8:
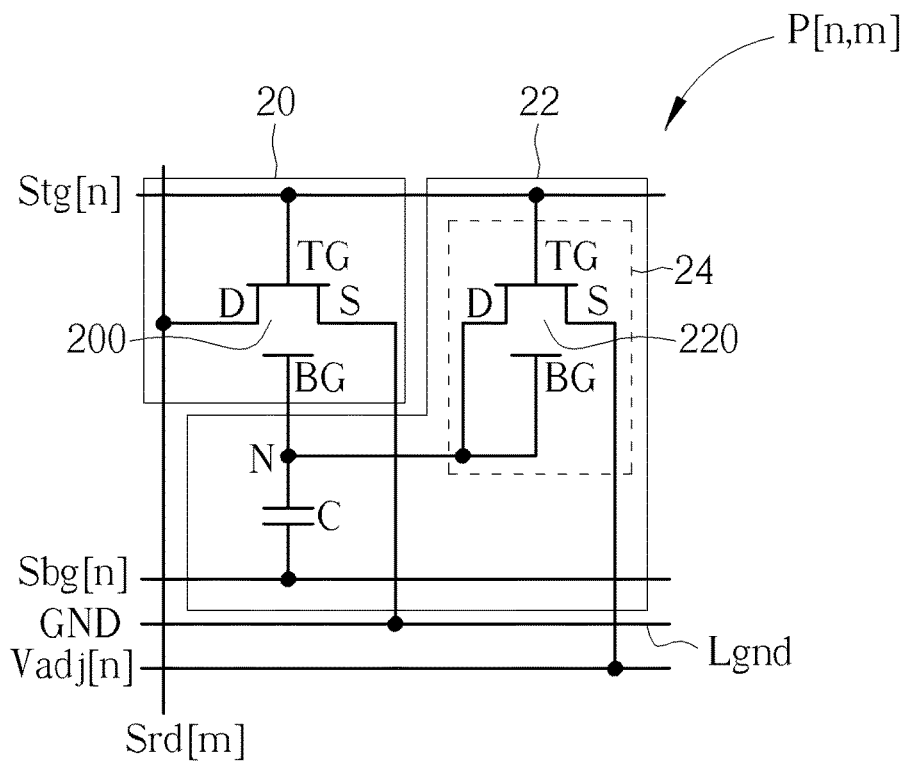
FIG. 8 is a circuit schematic diagram of other exemplary pixels of the photo sensor array in FIG. 1.

FIGS. 7 and 8 show photo sensor pixels in a first row n and a second row (n−1) of the photo sensor array 16, providing further adjustability of the readout voltage to the first sensing transistor 200.

In FIG. 7, the circuit configuration of the photo sensor pixel P[n,m] is almost identical to that in FIG. 2, except that the source of the first reference transistor 220 is coupled to a bottom gate line Lbg[n−1] rather than the ground voltage line Lgnd. A photo sensor pixel P[(n−1),m] has a circuit configuration identical to that of the photo sensor pixel P[n,m], and comprises a second sensing module 70 and a second threshold voltage generation module 72. The second sensing module 70 comprises a second sensing transistor 700 having a first gate TG, a second gate BG coupled to the bottom gate lines Lbg[n−1] via the second threshold voltage generation module 72, a semiconductor layer disposed between the first gate TG and the second gate BG, a drain D coupled to the readout line Lrd[m] and a source S coupled to the ground voltage line Lgnd carrying the ground voltage GND.

The second threshold voltage generation module 72 comprises a node N coupled to the second gate BG of the second sensing transistor 700, and configured to provide a second threshold voltage in a dark state to the node N of the second threshold voltage generation module 72.

The first sensing module 20 and the first threshold voltage generation module 22 of the photo sensor pixel P[n,m] are arranged in the first row n, and the second sensing module 70 and the second threshold voltage generation module 72 of a photo sensor pixel P[(n−1),m] are arranged in the second row (n−1). The first row n is adjacent to the second row (n−1).

The bottom gate line Lbg[n−1] carries a bottom gate signal Sbg[n−1] configured to read light information captured by the second sensing module 70. Since the low voltage level of the bottom gate signal Sbg[n−1] may be different from the ground voltage GND, and in some embodiments, the low voltage level of the bottom gate signal Sbg[n−1] may be less than the ground voltage GND, rather than fixed at the first threshold voltage in the dark state, the readout voltage may be shifted from the first threshold voltage according to a difference between the low voltage level of the bottom gate signal Sbg[n−1] and the ground voltage GND, thereby adjusting the leakage currents of the first sensing transistor 200 in the dark state and the bright state. In some embodiments, the low voltage level of the bottom gate signal Sbg[n−1] may be set to 0V or above to adjust the readout voltage toward a positive direction with respect to the first threshold voltage in the dark state.

Although FIG. 7 shows the embodiment of coupling the source of the first reference transistor 220 to an immediately preceding bottom gate line Lbg[n−1], the disclosure is not limited thereto, the source of the first reference transistor 220 may also be coupled to another preceding bottom gate line such as a preceding bottom gate line Lbg[n−2], an immediately succeeding bottom gate line Lbg[n+1], or another succeeding bottom gate line such as a succeeding bottom gate line Lbg[n+2].

In FIG. 8, the circuit configuration of the photo sensor pixel P[n,m] is almost identical to that in FIG. 2, except that the source S of the first reference transistor 220 is coupled to an adjustment line Ladj[n] rather than ground voltage line Lgnd. The adjustment line Ladj[n] carries an adjustable ground voltage Vadj[n] different from the ground voltage GND, and in some embodiments, the adjustable ground voltage Vadj[n] may be less than the ground voltage GND. In other embodiments, the adjustable ground voltage Vadj[n] may be set to 0V or above to adjust the readout voltage toward a positive direction with respect to the first threshold voltage in the dark state. Since the source S of the first sensing transistor 200 and the source S of the first reference transistor 220 are respectively coupled to the ground voltage GND and the adjustable ground voltage Vadj[n], the readout voltage supplied to the second gate BG of the first sensing transistor 200 may be shifted from the first threshold voltage according to a difference between the adjustable ground voltage Vadj[n] and the ground voltage GND, so as to adjust the leakage currents of the first sensing transistor 200 in the dark state and the bright state.

Figure 9:
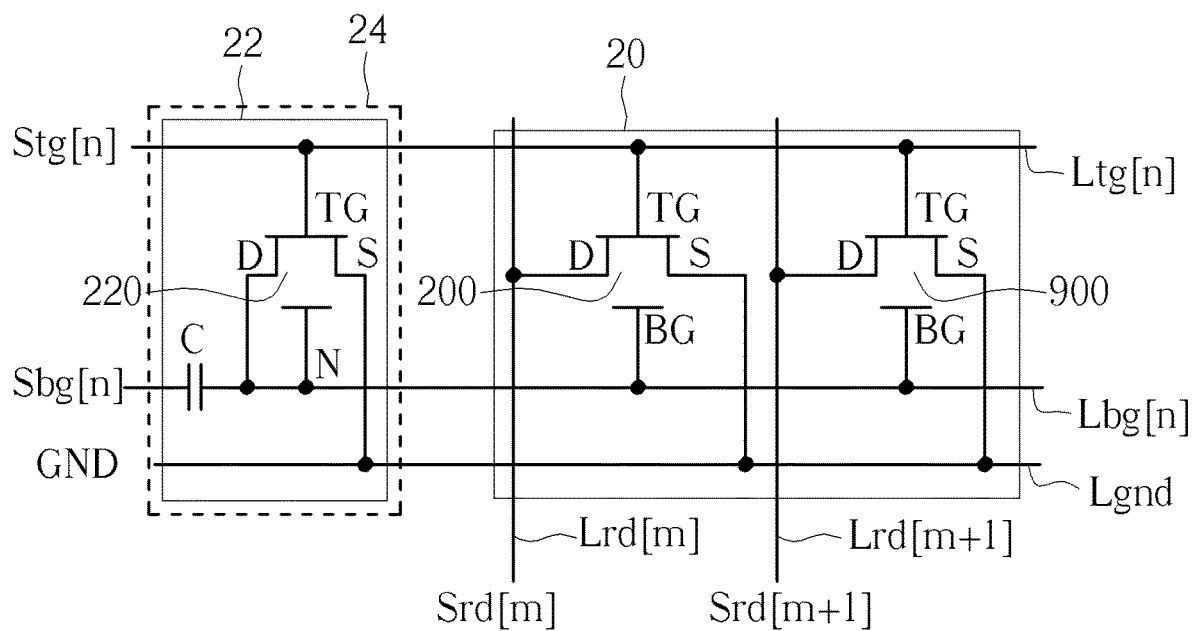
FIG. 9 is a circuit schematic diagram of other exemplary pixels of the photo sensor array in FIG. 1.
Figure 10:
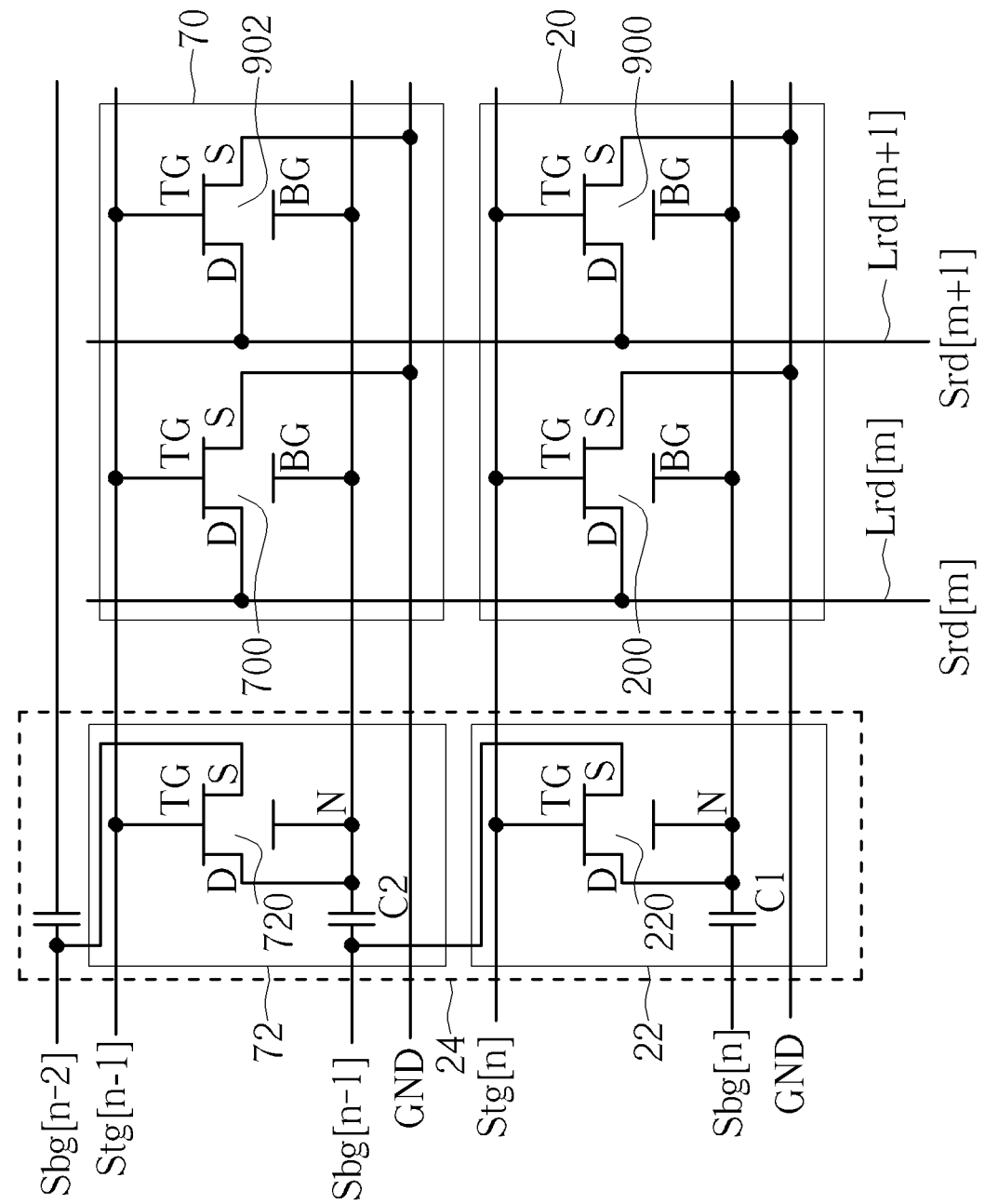
FIG. 10 is a circuit schematic diagram of other exemplary pixels of the photo sensor array in FIG. 1.

FIGS. 9 and 10 show embodiments of two photo sensor pixels in a row n sharing a common threshold voltage generation module 22. The circuit configuration in FIG. 9 is almost identical to FIG. 2, except the threshold voltage generation module 22 is shared by two or more photo sensor pixels. Specifically, the first sensing module 20 further comprises a third sensing transistor 900 having a first gate TG coupled to the top gate line Ltg[n], a second gate BG coupled to the bottom gate line Lbg[n] and the first threshold voltage generation module 22, a semiconductor layer disposed between the first gate TG and the second gate BG, a drain D coupled to the readout line Lrd[m+1] and a source S coupled to the ground voltage line Lgnd. The first threshold voltage generation module 22, the first sensing transistor 200 and the third sensing transistor 900 are arranged in the row n. The first threshold voltage generation module 22 is shared by the first sensing transistor 200 and the third sensing transistor 900 and may provide the readout voltage to the first sensing transistor 200 and the third sensing transistor 900. In addition, the shape of the light-blocking material 24 may be modified to satisfy layout requirements. In some embodiments, the light-blocking material 24 may cover the first reference transistor 220 and the capacitors C as shown in FIG. 9. In other embodiments, the light-blocking material 24 may cover only the first reference transistor 220.

The circuit configuration in FIG. 10 is almost identical to FIG. 7, except that each threshold voltage generation module 22 is shared by two or more photo sensor pixels. Specifically, the first sensing module 20 further comprises a third sensing transistor 900, and the second sensing module 70 further comprises a fourth sensing transistor 902, as shown in FIG. 10. The first threshold voltage generation module 22 is shared by the first sensing transistor 200 and the third sensing transistor 900 and may provide the readout voltage to the first sensing transistor 200 and the third sensing transistor 900, and the second threshold voltage generation module 72 is shared by the second sensing transistor 700 and the fourth sensing transistor 902 and may provide the readout voltage to the second sensing transistor 700 and the fourth sensing transistor 902. In comparison to the embodiments in FIGS. 2 and 7, the spaces taken up by the photo sensor array 16 in FIGS. 9 and 10 are reduced since one common threshold voltage generation module 22 is shared by multiple photo sensor pixels. Moreover, the shape of the light-blocking material 24 may be modified to satisfy layout requirements. In some embodiments, the light-blocking material 24 may cover the first reference transistor 220, the second first reference transistor 720, and the capacitors C1, C2, as shown in FIG. 10. In other embodiments, the light-blocking material 24 may cover only the first reference transistor 220 and the second first reference transistor 720.

Various embodiments of electronic device 1 and photo sensor pixels in FIGS. 1, 2, 5 through 10 utilize a threshold voltage generation module to adaptively generate a first threshold voltage in a dark state independent of process variations and temperature variations to read the light information captured by a sensing module, thereby increasing a dynamic range of image sensing and enhancing image quality.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
a first sensing module comprising a first sensing transistor having a first gate, a second gate and a semiconductor layer, the semiconductor layer of the first sensing transistor being disposed between the first gate and the second gate of the first sensing transistor, and the first gate of the first sensing transistor being coupled to a top gate line;
a first bottom gate line carrying a first bottom gate signal configured to read light information captured by the first sensing module; and
a first threshold voltage generation module comprising:
a node coupled to the second gate of the first sensing transistor, and configured to provide a first threshold voltage in a dark state to the node of the first threshold voltage generation module;
a first reference transistor having a first gate, a second gate, a semiconductor layer disposed between the first gate and the second gate of the first reference transistor, a source and a drain, shielded by a light-blocking material, and configured to generate the first threshold voltage in the dark state, wherein the drain of the first reference transistor is coupled to the second gate of the first reference transistor; and
a first clamping circuit coupled to the first sensing transistor, the first reference transistor and the first bottom gate line.

2. The electronic device of claim 1, wherein the first clamping circuit comprises a clamp capacitor having a first terminal coupled to the first sensing transistor and the first reference transistor, and a second terminal coupled to the first bottom gate line.

3. The electronic device of claim 1, wherein the first clamping circuit comprises a resistor having a first terminal coupled to the first sensing transistor and the first reference transistor, and a second terminal coupled to the first bottom gate line.

4. The electronic device of claim 1, further comprising a ground voltage line carrying a ground voltage, wherein the first threshold voltage generation module further comprises a bias resistor coupled between a supply voltage and the second gate of the first reference transistor, and the first clamping circuit comprises a multiplexer coupled to the first sensing transistor, the first reference transistor, the first bottom gate line and the ground voltage line, and configured to select one between the first threshold voltage in the dark state and the ground voltage according to the first bottom gate signal and output the selected one as a readout voltage to the first sensing transistor.

5. The electronic device of claim 4, wherein the supply voltage exceeds the first threshold voltage in the dark state.

6. The electronic device of claim 1, further comprising a ground voltage line carrying a ground voltage, wherein the first sensing transistor further comprises a source coupled to the ground voltage line, and the source of the first reference transistor is coupled to the ground voltage line.

7. The electronic device of claim 1, further comprises:
a second sensing module comprising a second sensing transistor having a first gate, a second gate and a semiconductor layer, the semiconductor layer of the second sensing transistor being disposed between the first gate and the second gate of the second sensing transistor;
a second threshold voltage generation module, arranged with the second sensing module in a second row adjacent to a first row, comprising a node coupled to the second gate of the second sensing transistor, and configured to provide a second threshold voltage in a dark state to the node of the second threshold voltage generation module; and
a second bottom gate line carrying a second bottom gate signal configured to read light information captured by the second sensing module; and
the source of the first reference transistor is coupled to the second bottom gate line;
wherein the first sensing module and the first threshold voltage generation module are arranged in a first row.

8. The electronic device of claim 7, wherein:
the first sensing module further comprises:
a third sensing transistor having a first gate, a second gate and a semiconductor layer, the semiconductor layer of the third sensing transistor being disposed between the first gate and the second gate of the third sensing transistor, the second gate of the third sensing transistor being coupled to the node of the first threshold voltage generation module, and the first threshold voltage generation module, the first sensing transistor and the third sensing transistor being arranged in the first row; and
the second sensing module further comprises:
a fourth sensing transistor having a first gate, a second gate and a semiconductor layer, the semiconductor layer of the fourth sensing transistor being disposed between the first gate and the second gate of the fourth sensing transistor, the second gate of the fourth sensing transistor being coupled to the node of the second threshold voltage generation module, and the second threshold voltage generation module, the second sensing transistor and the fourth sensing transistor being arranged in the second row.

9. The electronic device of claim 7, wherein the second bottom gate signal has a low voltage level less than the ground voltage.

10. The electronic device of claim 7, wherein the second row precedes the first row.

11. The electronic device of claim 7, wherein the second row succeeds the first row.

12. The electronic device of claim 1, further comprising a ground voltage line carrying a ground voltage and an adjustment line carrying an adjustable ground voltage different from the ground voltage, wherein the first sensing transistor further comprises a source coupled to the ground voltage line, and the source of the first reference transistor is coupled to the adjustment line.

13. The electronic device of claim 12, wherein the adjustable ground voltage is less than the ground voltage.

14. The electronic device of claim 1, wherein the first sensing transistor and the first reference transistor are n-type double gate thin-film transistors.

15. The electronic device of claim 1, wherein the first sensing transistor and the first reference transistor are p-type double gate thin-film transistors.

16. The electronic device of claim 1, wherein the semiconductor layer is fully shielded by the light-blocking material.

17. The electronic device of claim 1, wherein:
the first sensing module further comprises a third sensing transistor having a first gate, a second gate and a semiconductor layer, wherein the second gate of the third sensing transistor is coupled to the node of the first threshold voltage generation module, the semiconductor layer of the third sensing transistor is disposed between the first gate and the second gate of the third sensing transistor, and the first threshold voltage generation module, the first sensing transistor and the third sensing transistor are arranged in a first row.

18. The electronic device of claim 1, wherein the top gate line carries a top gate signal indicative of when to reset the first sensing module, and the first gate of the first reference transistor is coupled to the top gate line.

19. The electronic device of claim 1, further comprising a readout line, wherein the first sensing transistor further comprises a drain coupled to the readout line.

* * * * *